United States Patent [19]
Kim

[11] Patent Number: 6,118,143
[45] Date of Patent: Sep. 12, 2000

[54] SOLID STATE IMAGE SENSOR

[75] Inventor: Yong Gwan Kim, Chungcheongnam-do, Rep. of Korea

[73] Assignee: LG Semicon Co., Ltd., Chungcheongbuk-Do, Rep. of Korea

[21] Appl. No.: 09/038,240

[22] Filed: Mar. 11, 1998

[30] Foreign Application Priority Data

Jun. 17, 1997 [KR] Rep. of Korea ............... 97/25231

[51] Int. Cl.⁷ ............................................. H01L 27/148
[52] U.S. Cl. ........................................ 257/249; 257/250
[58] Field of Search .................................. 257/249, 250

Primary Examiner—Mark V. Prenty
Attorney, Agent, or Firm—Morgan, Lewis & Bockius LLP

[57] ABSTRACT

A solid state image sensor includes a photodiode, a vertical charge coupled device positioned to a side of the photodiode for transmitting charges generated in the photodiode, a first polygate extending in a horizontal direction and partly overlapping the vertical charge coupled device, and a second polygate extending in a horizontal direction, partly overlapping the vertical charge coupled device and having a second polygate extension, wherein the second polygate extension extends for substantially an entire length of the side of the photodiode.

26 Claims, 12 Drawing Sheets

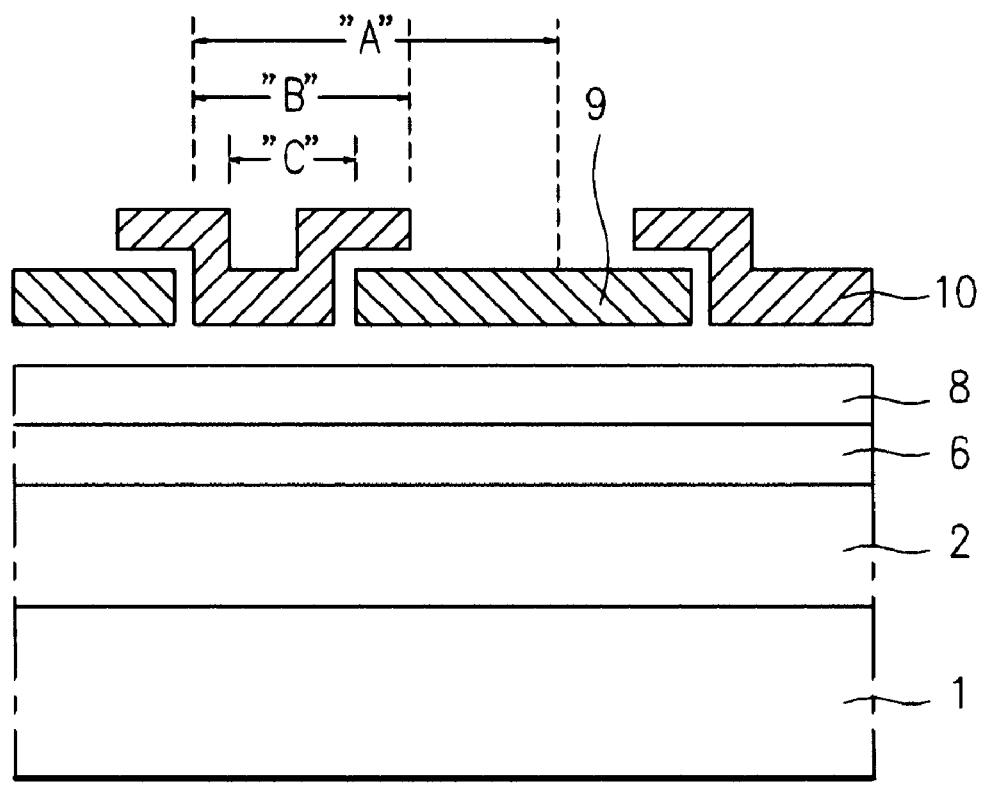

"D"

SOLID STATE IMAGE SENSOR

This application claims the benefit of Korean Patent Application No. 25231/1997, filed Jun. 17, 1997, which is hereby incorporated by reference.

BACKGROUND OF THE INVENTION

1. Field of the Invention

The present invention relates to a solid state image sensor, and, more particularly, to a solid state image sensor in which a charge generated in a photodiode can easily transfer to a vertical charge coupled device.

2. Discussion of the Related Art

In general, a solid state image sensor has photoelectric conversion cells (for example, photodiodes) and charge coupled devices for taking an image and outputting an electric signal corresponding to the image. The charge coupled device utilizes a potential difference in a substrate for transmitting a charge generated in the photoelectric conversion cells in a particular direction. The solid state image sensor includes a large number of photoelectric conversion cells, and vertical charge coupled devices (VCCDs) formed between the photoelectric conversion cells for transmission of the charges generated in the photoelectric conversion cells in a vertical direction. The solid state image sensor also includes a horizontal charge coupled device (HCCD) for transmission of the signal charges transmitted in the vertical direction by the VCCDs in a horizontal direction again, and a floating diffuser for sensing and amplifying the electric signal transmitted in the horizontal direction and outputting the signal changes to peripheral circuits.

The conventional solid state image sensor will be further explained with reference to the attached drawings. FIG. 1 illustrates a layout of the conventional solid state image sensor, FIG. 2a illustrates a section of the conventional solid state image sensor shown in FIG. 1 across line I–I', FIGS. 2b and 2c illustrate potential profiles of the conventional solid state image sensor shown in FIG. 2a, and FIG. 3 is a cross-section across line II–II' of FIG. 1. For ease of explanation, the photodiode of FIG. 1 will be referred to as having a top side, a left side, a right side, and a bottom side. The top-bottom direction will be referred to as vertical direction (corresponding to a direction of a column of photodiodes in a matrix), and the left-right direction will be referred to as horizontal direction (corresponding to a direction of a row of photodiodes). It will be clear to one skilled in the art that the designations of directions are arbitrary and illustrative only.

Referring to FIGS. 1 and 2a, the conventional solid state image sensor includes a photodiode 5 having a PD-N region 3 and a PD-P region 4 in a first p-type well region 2 formed in an n-type semiconductor substrate 1 for converting a photo signal into an electric signal. A vertical charge coupled device (VCCD) 8 is located to the right of the photodiode 5 for transmission of the charge from the photodiode 5 in a vertical direction. A channel stop layer 7 is formed around the photodiode 5 and excluding a portion of the photodiode 5 on the right side of the photodiode 5 which is used to transmit the charge outputted by the photodiode 5 to the VCCD 8. First and second polygates 9 and 10 are formed in part over the VCCD 8 and in part overlapping each other, as shown in FIG. 1. The VCCD 8 is formed in a second p-type well 6 formed in the first p-type well 2 excluding portions of the photodiode 5 and the channel stop layer 7. The portion through which the electric signal from the photodiode 5 is transmitted to the VCCD 8 is formed on the right side of the photodiode 5. A width of a side of the photodiode 5 facing the VCCD 8 (i.e. the dimension of the right side of the photodiode 5 in the vertical direction) is denoted as "A". The second polygate 10 has a second polygate extension extending in a downward vertical direction between the photodiodes 5, located to the right of the photodiode 5 and partly overlapping the VCCD 8. The first polygate 9 has a first polyate extension extending in an upward vertical direction from the second polygate 9, partly overlapping the second polygate extension 10a, located to the right of the photodiode 5 and partly overlapping the VCCD 8. A width of the photodiode 5 corresponding to the second polygate extension 10a (which is used to transmit the charge from the photodiode 5 to the VCCD 8) is denoted as "B". A width of a gap in the channel stop region 7 on the right side of the photodiode 5 through which the charge from the photodiode 5 can be transmitted (i.e. a region around the photodiode 5 without the channel stop layer 7) is denoted as "C".

The potential profiles of the conventional solid state image sensor will be explained with reference to FIGS. 2b and 2c.

FIG. 2b illustrates a potential profile in the photodiode 5 after the photodiode 5 has been generating charge for a certain time period. With a bias of between 0 and 9 v applied to the second polygate 10 (which is used as a transfer gate), the photodiode 5 outputs the charge to the HCCD (not shown) step by step according to clock pulses applied to the first polygate 9 (not shown in FIG. 2a) when a voltage level of the first polygate 9 is different from a voltage level of the second polygate 10. In this case, the first p-type well 2 between the n-type VCCD 8 and the photodiode 5 acts as a barrier that blocks the charge collected in the photodiode 5 from being transmitted to the VCCD 8.

FIG. 2c illustrates a potential profile in the photodiode 5 when charge generated in the photodiode 5 for the certain time period is being transferred to the VCCD 8. With a bias as high as 15 v applied to the second polygate 10 (which is used as a transfer gate), the potential in the first p-type well 2 which acted as the barrier between the VCCD 8 and the photodiode 5 is lowered, allowing a transfer of the charge in the photodiode 5 to the VCCD 8, so that the charge can then be read out. That is, referring to FIG. 1, the voltage of the polygate 10 is lowered to read out the charge generated in the photodiode 5 through a side corner portion of the photodiode 5 (i.e. top right corner), rather than a center portion of the photodiode 5.

FIG. 3 illustrates a cross-section of the conventional solid state image sensor across line II–II' of FIG. 1, showing different layers above and below the VCCD 8.

Referring to FIG. 3, the conventional solid state image sensor includes first and second p-type wells 2 and 6 in an n-type semiconductor substrate 1, a VCCD 8 formed in the second p-type well 6, a first polygate 9 over the VCCD 8, and a second polygate 10 at a side of the first polygate 9 whose edge portion overlaps an edge portion of the first polygate 9.

FIG. 4 illustrates a potential contour when a high bias is applied to the second polygate 10, which is used as a transfer gate in the conventional solid state image sensor.

Referring to FIG. 4, the charge generated in the photodiode 5 is read out when the high bias of 15 v is applied to the transfer gate through the portion of the first p-type well 2 overlapping the photodiode 5, and the potential in the portion of the first p-type well 2 is lowered by the high bias applied to the second polygate 10. However, since the portion through which the charges are read out lies not at the center, but in the corner of the photodiode 5, some of the charges generated in the photodiode 5 are not read out completely, but remain in the photodiode 5 (denoted as portion "D") for a certain duration. This reduces efficiency of the solid state image sensor, resulting in a degraded picture quality.

SUMMARY OF THE INVENTION

Accordingly, the present invention is directed to a solid state image sensor that substantially obviates one or more of the problems due to the limitations and disadvantages of the related art.

An object of the present invention is to provide a solid state image sensor which can easily transfer a charge from a photodiode to a VCCD.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages and in accordance with the purpose of the present invention, as embodied and broadly described, in a first aspect of the present invention there is provided a solid state image sensor includes a photodiode, a vertical charge coupled device positioned to a side of the photodiode for transmitting charges generated in the photodiode, a first polygate extending in a horizontal direction and partly overlapping the vertical charge coupled device, and a second polygate extending in a horizontal direction, partly overlapping the vertical charge coupled device and having a second polygate extension, wherein the second polygrate extension extends for substantially an entire length of the side of the photodiode.

In a second aspect of the present invention there is provided a solid state image sensor including a plurality of photodiodes arranged in columns and rows, a plurality of vertical charge coupled devices formed between the columns and extending in a direction of the columns, a plurality of first polygates extending in a direction of the rows of the photodiodes, located between the rows of the photodiodes and each having a first polygate extension overlapping the plurality of vertical charge coupled devices, and a plurality of second polygates extending in a direction of the rows of the photodiodes, insulated from the plurality of first polygates, overlapping the plurality of first polygates and each having a second polygate extension extending for a full width of a side of a photodiode facing a corresponding vertical charge coupled device, overlapping the vertical charge coupled devices and overlapping a corresponding first polygate extension.

In a third aspect of the present invention there is provided a solid state image senor including a matrix of a plurality of photodiodes arranged in rows and columns, a plurality of charge coupled devices formed between the columns of the photodiodes, a plurality of first polygates extending in a direction of the rows of the photodiodes, located between the rows of the photodiodes and each having a first polygate extension overlapping the plurality of charge coupled devices, a plurality of second polygates extending in a direction of the rows of the photodiodes, formed between a first group of alternating rows of the photodiodes, insulated from the plurality of first polygates, overlapping the plural- ity of first polygates and each having a second polvgate extension extending for a full width of a side of a photodiode facing a corresponding vertical charge coupled device, overlapping the charge coupled devices and overlapping a corresponding first polygate extension, and a purality of third polygates extending in a direction of the rows of the photodiodes, formed between a second group of alternating rows of the photodiodes, insulated from the plurality of first polygates, overlapping the plurality of first polygates and each having a second polygate extension extending for a full width of a side of a photodiode facing a corresponding vertical charge coupled device, overlapping the charge coupled devices and overlapping a corresponding first polygate extension.

In a fourth aspect of the present invention there is provided a solid state image sensor including a matrix of photodiodes arranged in horizontal rows and vertical colums, charge coupled devices extending between adjacent columns, first polygates each formed elongated between every adjacent rows of the photodiodes with a portion at every region crossing the charge coupled devices and flaring out in the direction away from a corresponding photodiode and over a corresponding charge coupled device, second polygates extending in a direction of the rows of the photodiodes, formed between a first group of alternating rows of the photodiodes, insulated from the plurality of first polygates, overlapping the plurality of first polygates and each having a second polygate extension extending for a fill width of a side of a photodiode facing a corresponding vertical charge coupled device, overlapping the charge coupled devices and overlapping a corresponding first polygate extension, third polygates extending in a direction of the rows of the photodiodes, formed between a second group of alternating rows of the photodiodes, insulated from the plurality of first polygates, overlapping the plurality of first polygates and each having a second polygate extension extending for a full width on a side of a photodiode facing a corresponding vertical charge coupled device, overlapping the charge coupled devices, overlapping, a corresponding first polygate extension, wherein the plurality of third polygates and the plurality of second polygates alternate.

In a fifth aspect of the present invention there is provided a solid state image sensor including a photodiode, a charge coupled device located at a side of the photodiode and extending in a vertical direction, a first polygate crossing the charge coupled device, extending in a horizontal direction and having a first polygate extension extending upward in a vertical direction, partly overlapping the charge coupled device and located at the side of the photodiode, and a second polygate crossing the charge coupled device, extending in a horizontal direction and having a second polygate extension extending downward in a vertical direction, partly overlapping the charge coupled device and located at the side of the photodiode, wherein the second polygate extension extends for a full width of the side of the photodiode.

In a sixth aspect of the present invention there is provided a solid state image sensor including a first photodiode located on a substrate and having a top side, a bottom side and a right side, a second photodiode located in a vertical direction from the top side of the first photodiode and having a top side, a bottom side and a right side, charge coupled devices located at the right sides of the first and second photodiodes, a first polygate located between the first and second photodiodes, crossing the charge coupled devices and having an extension overlapping the charge coupled devices and extending upward from the first polygate, a second polygate located above the second photodiode, crossing the charge coupled devices and having a second polygate extension overlapping the charge coupled devices, extending downward from the second polyyate and partly overlapping the first polyygate, a third polygate located between the first and second photodiodes, crossing the charge coupled devices and having a third polygate extension overlapping the charge coupled devices, extending downward from the third polygate and partly overlapping another first polygate located below the bottom side of the first polygate, wherein the second polygate extension is at least as long as the right side of the second photodiode, wherein the third polygate extension is at least as long as the light side of the first photodiode, wherein the second polygate extension overlaps a portion of the second photodiode, wherein the third polyaate extension overlaps a portion of the first photodiode, wherein the third polygate extension overlaps a portion of the third polygate, and wherein the second polygate and the first polygate are formed on different layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention that together with the description serve to explain the principles of the invention.

In the drawings:

FIGS. 2b and 2c illustrate potential profiles of the conventional solid state image sensor of FIG. 2a;

FIG. 3 is a cross-section of the conventional solid state image sensor across line II–II' of FIG. 1;

DETAILED DESCRIPTION OF THE PREFERRED EMBODIMENTS

Reference will now be made in detail to the preferred embodiments of the present invention, examples of which are illustrated in the accompanying drawings.

Figure 1:
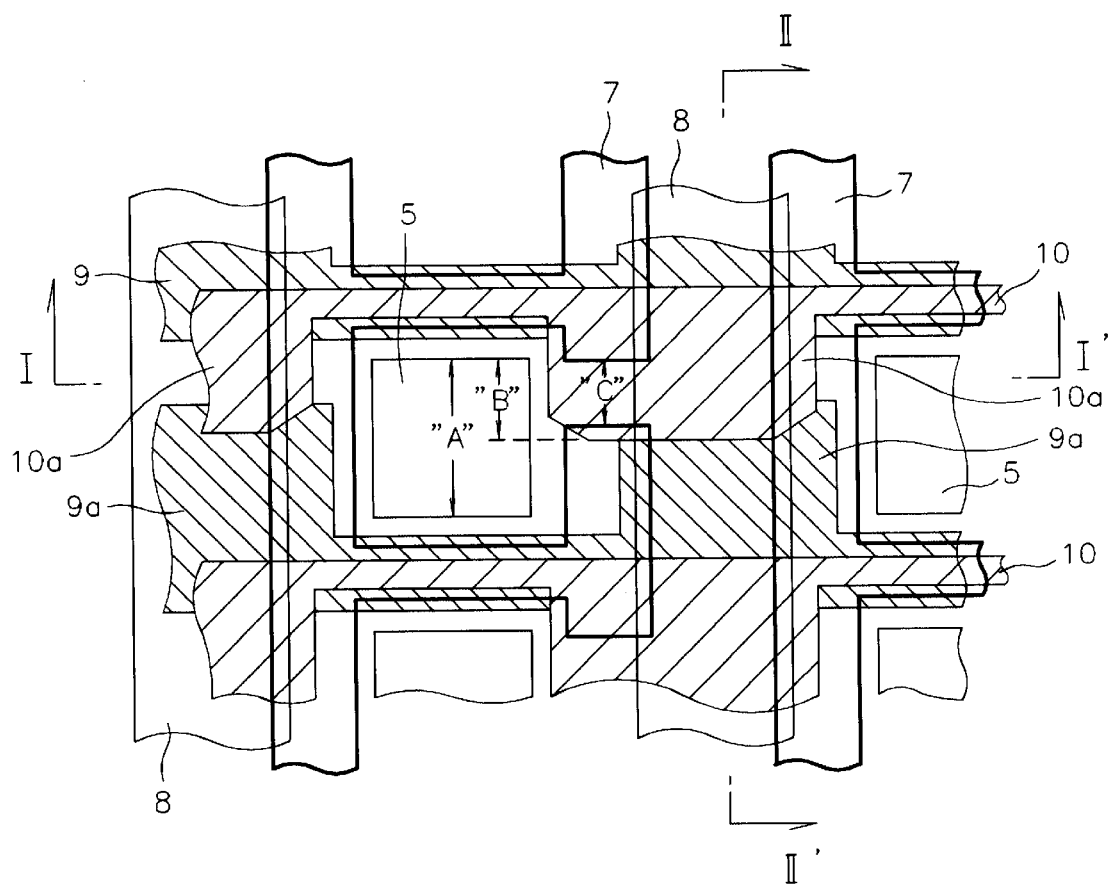
FIG. 1 illustrates a layout of a conventional solid state image sensor.
Figure 2A:
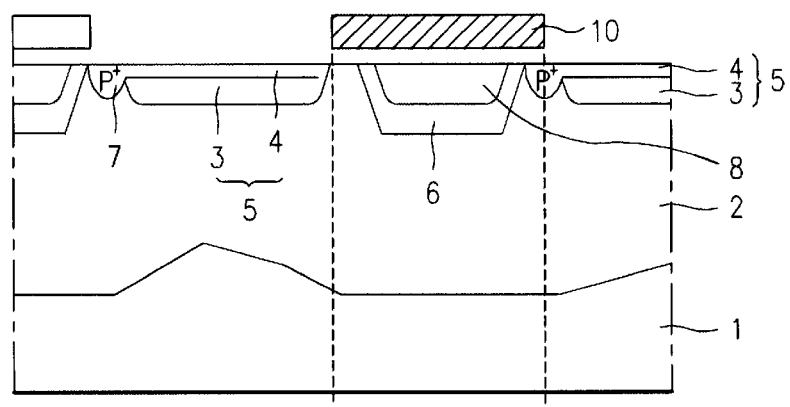
FIG. 2a illustrates a cross-section of the conventional solid state image sensor alone line I–I' of FIG. 1.
Figure 2B:
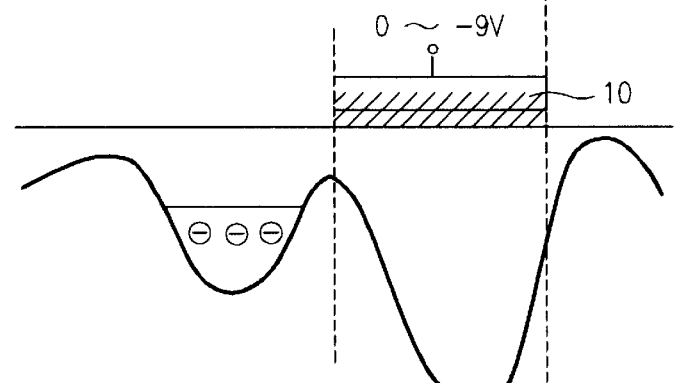
Figure 2C:
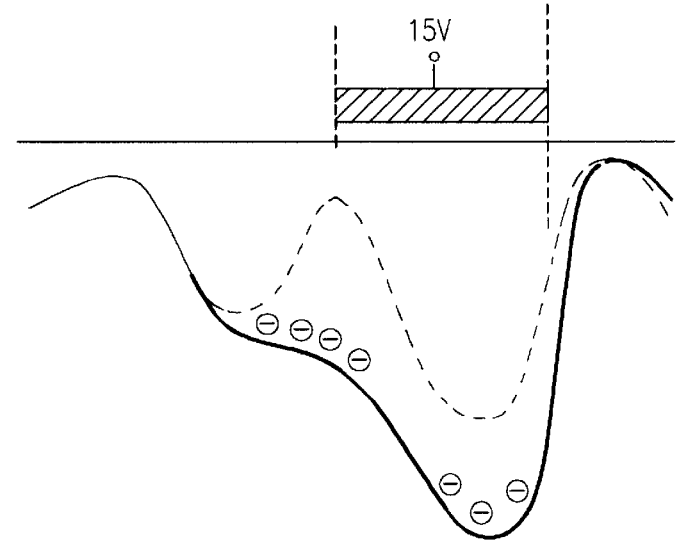
Figure 4:
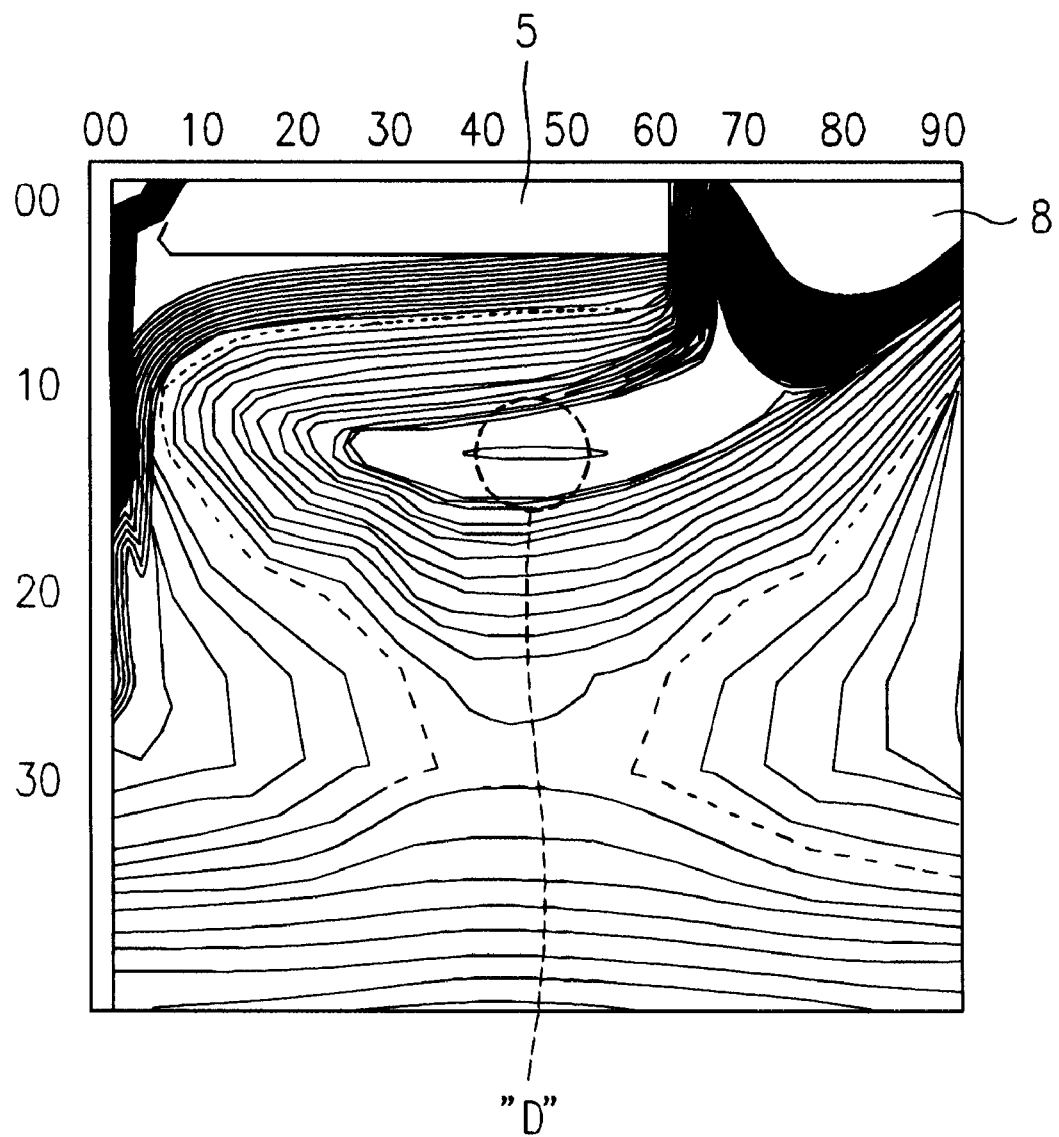
FIG. 4 illustrates a potential contour when a high bias is applied to the second polygate of the conventional solid state image sensor of FIG. 1.
Figure 5:
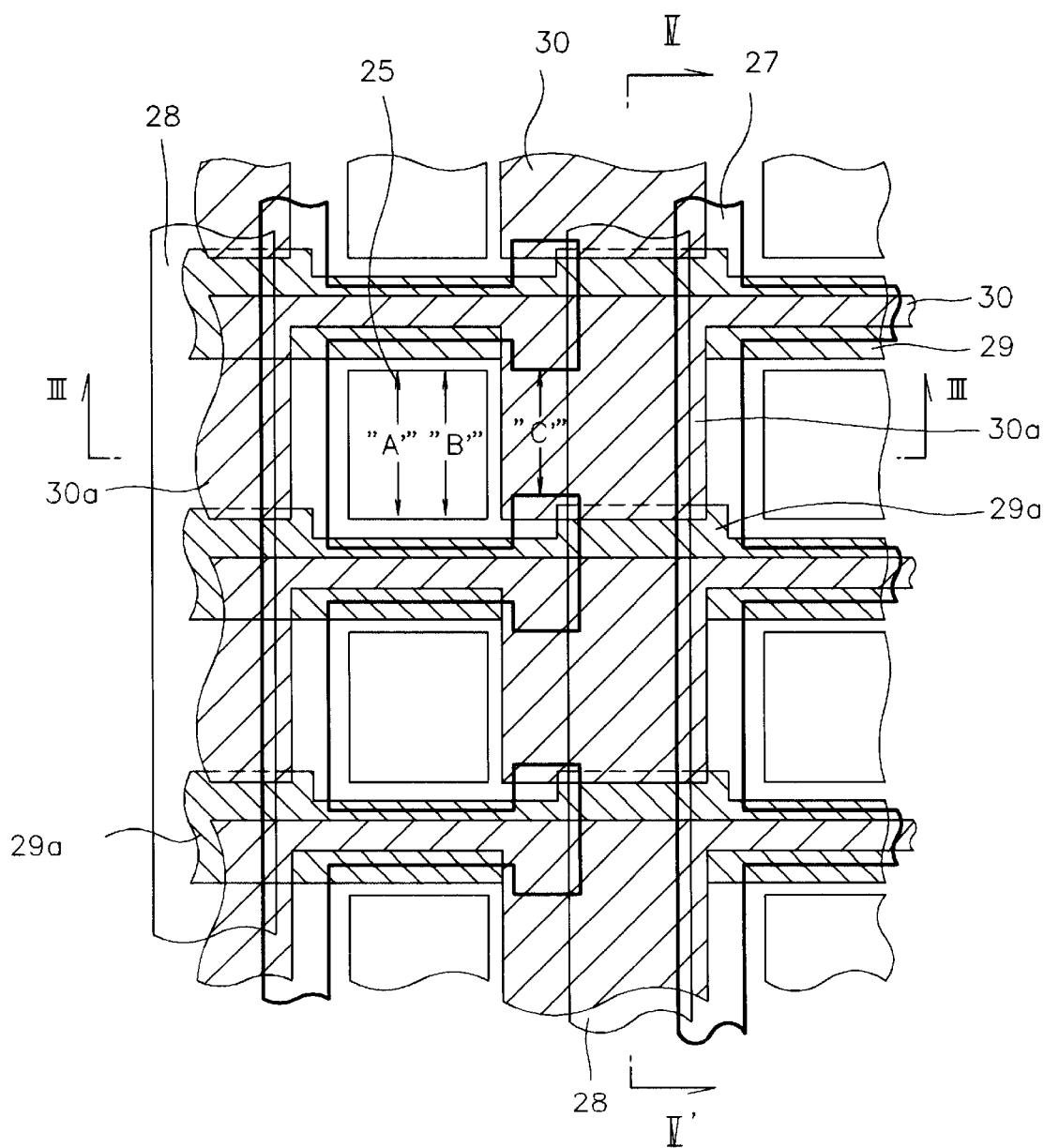
FIG. 5 illustrates a layout of a solid state image sensor according to a first preferred embodiment of the present invention.
Figure 6:
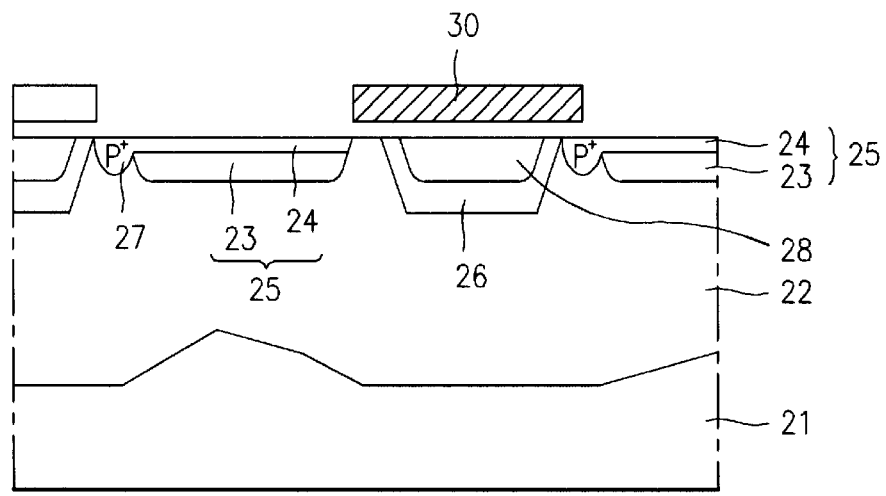
FIG. 6 illustrates a cross-section of the solid state image sensor of FIG. 5 across line III–III'.
Figure 7:
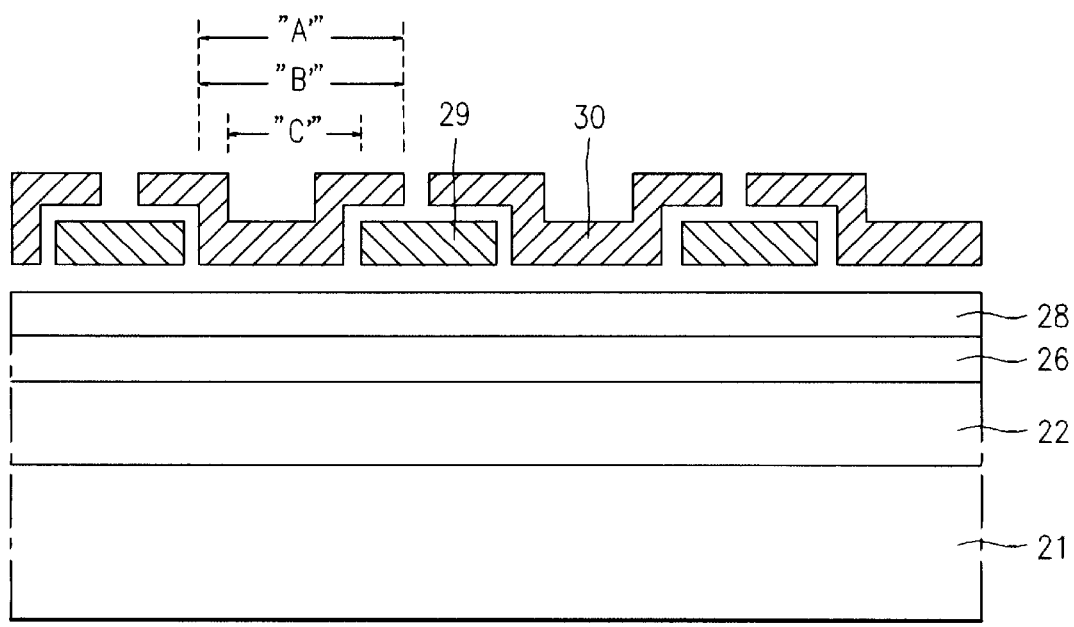
FIG. 7 illustrates a cross-section of the solid state image sensor across line IV–IV' of FIG. 5.

FIG. 5 illustrates a layout of a solid state image sensor according to a first preferred embodiment of the present invention, FIG. 6 illustrates a cross-section of the solid state image sensor across line III–III' of FIG. 5, and FIG. 7 illustrates a cross-section of the solid state image sensor across line IV–IV' of FIG. 5.

In the solid state image sensor of the present invention, a polygate (for use as a transfer gate) is formed having a width which is the same as a width of a photodiode (here, the term "photodiode" shall refer broadly to any type of a photoelectric conversion cell). Referring to FIG. 5, the solid state image sensor according to a first preferred embodiment of the present invention includes a matrix of photodiodes 25 which form rows and columns of photodiodes 25. Vertical charade coupled devices (VCCDS) 28 are formed between adjacent columns of the photodiodes 25 extending in a vertical direction. The VCCDs 28 transmit charges generated in the adjacent columns of the photodiodes 25 along a vertical direction. A first polygate 29 is formed extending in a horizontal direction and having a first polygate extension 29a positioned to the right of the photodiode 25 which partly overlaps the VCCD 28 and extends in the vertical upward direction from the first polygate 29. A second polygate 30 is formed extending in a horizontal direction partly overlapping the first polygate 29. The second polygate 30 is insulated from the first polygate 29 and has a second polygate extension 30a positioned to the right of the photodiode 25, extending vertically downward from the second polygate 30, partly overlapping the VCCD 28 and partly overlapping the first polygate extension 29a, such that the second polygate extension 30a extends down for a full width "A"' of the photodiode 25. A channel stop layer 27 is formed around every photodiode 25, having a gap on the right side of the photodiode 25 through which the charge generated in the photodiode 25 is transmitted to the VCCD 28. In the first embodiment of the present invention, the width of the photodiode 25 on the right side of the photodiode 25 (i.e. on the side facing the VCCD 28) is designated as "A", a length of the second polygate extension 30a is designated as "B"', and a width of the gap in the channel stop layer 27 is designated as "C"'. It can be seen from the above description and the figures that C' is almost identical to A'.

Referring to FIGS. 6 and 7, the solid state image sensor according to the first preferred embodiment of the present invention includes the first p-type well 22 formed in an n-type semiconductor substrate 21. The photodiodes 25 each have the PD-N region 23 and the PD-P region 24 tor converting the photo signal into an electrical signal. The VCCDs 28 are formed on the right side of the photodiode 25 for transmission of the charge outputted bv photodiode 25 in a vertical direction. The channel stop layer 27 is formed around the photodiode 25, partly overlapping the VCCD 28 but excluding the gap through which the charge 25 is transmitted from the photodiode 25 to the VCCD 28. The VCCD 28 is formed within the second p-type well 26 which is formed in the first p-type well 22 excluding the photodiode 25 and the channel stop layer 27. The second polygate 30 has a transfer clock signal applied to it.

In the first embodiment of the solid state image sensor of the present invention, the second polygate extension 30a (which is part of a transfer gate formed over the VCCD 28) has the length B' substantially identical to the photodiode 25, since the width A' of a side of the photodiode 25 (i.e. on the right side of the photodiode 25 and near the VCCD 28) and the length B' of the second polygate extension 30a (which is a transmission length for transmission of the charge from the photodiode 25) are substantially identical, and the width C' is very similar to the width A'. It can be seen that it is easy to transfer the charge from the photodiode 95. The second polygate extension 30a be even longer than the width A' of the right side of the photodiode 25, although adjacent second polygates 30 should not be in contact with each other.

Figure 8:
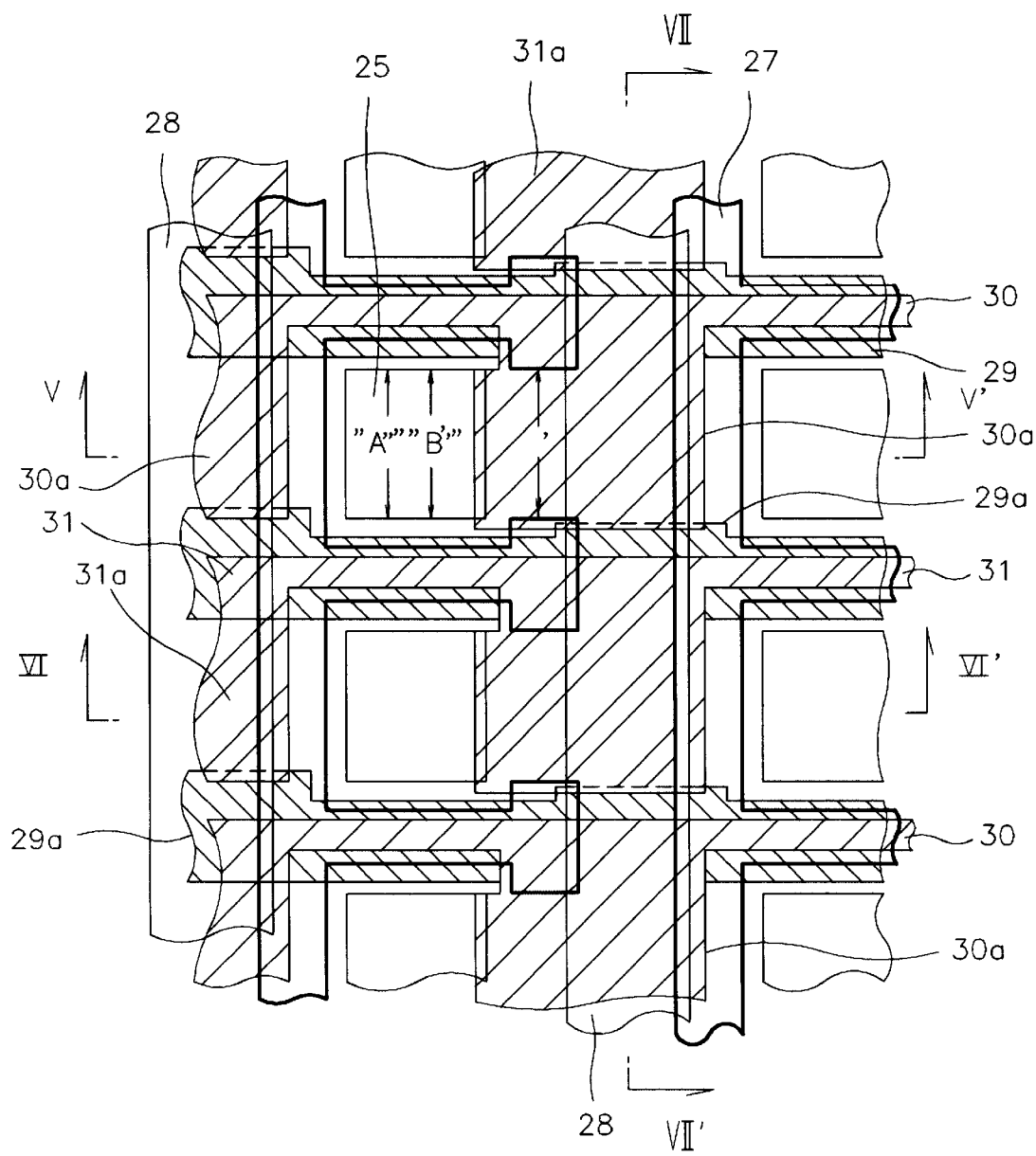
FIG. 8 illustrates a layout of a solid state image sensor according to a second preferred embodiment of the present invention.
Figure 9:
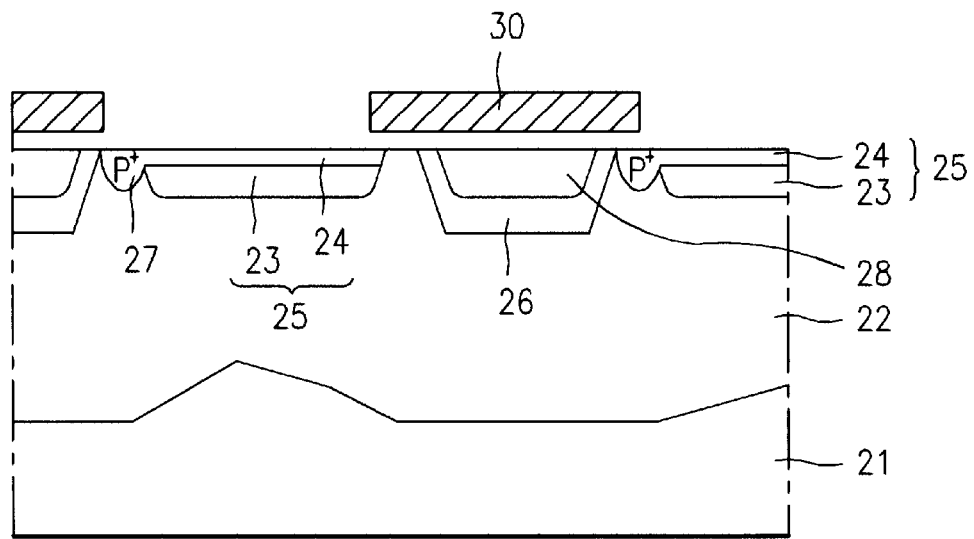
FIG. 9 illustrates a cross-section of the solid state image sensor across line V–V' of FIG. 8.
Figure 10:
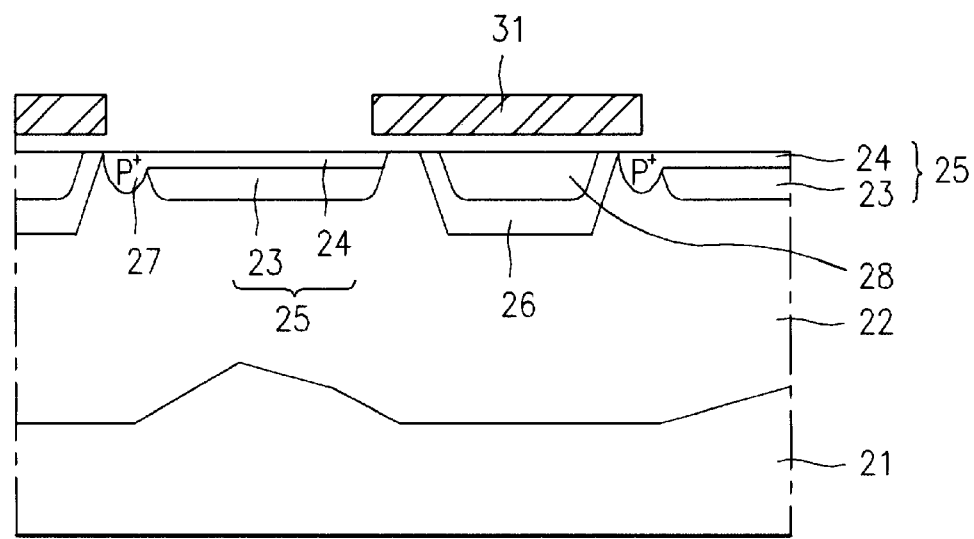
FIG. 10 illustrates a cross-section of the solid state image sensor across line VI–VI' of FIG. 8.
Figure 11:
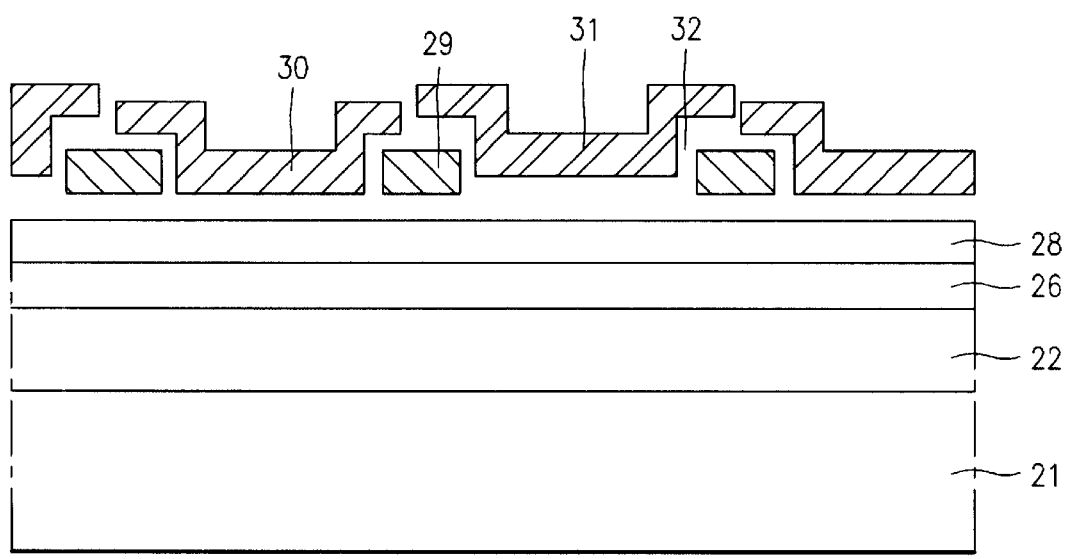
FIG. 11 illustrates a cross-section of the solid state image sensor across line VII–VII' of FIG. 5.

FIG. 8 illustrates a layout of a solid state image sensor according to a second preferred embodiment of the present invention, FIG. 9 illustrates a cross-section of the solid state image sensor across line V–V' of FIG. 8, FIG. 10 illustrates a cross-section of the solid state image sensor across line VI–VI' of FIG. 8, and FIG. 11 illustrates a cross-section of the solid state image sensor across line VII–VII' of FIG. 8.

Referring to FIGS. 8–10, the solid state image sensor according, to the second preferred embodiment of the present invention includes a first p-type well 22 formed In an n-type semiconductor substrate 21. A matrix of photodiodes 25 is formed having a PD-N region 23 and a PD-P region 24 in the first p-type well 22 for converting a photo signal into an electrical signal. Referring to FIG. 8, the solid state image sensor according to the second preferred embodiment of the present invention includes a matrix of photodiodes 25 which form rows and columns of photodiodes 25. Vertical charge coupled devices (VCCDs) 28 are formed between adjacent columns of the photodiodes 25 extending in a vertical direction. The VCCDs 28 transmit charges generated in the adjacent columns of the photodiodes 25 along a vertical direction. A first polygate 29 is formed extending in a horizontal direction and having a first polygate extension 29a positioned to the right of the photodiode 25, partly overlapping the VCCD 28, and extending in the vertical upward direction. (It should be evident from this description and the figures that a plurality of first, second and third polygates are actually formed.) A second polygate 30 is formed extending in a horizontal direction over the first polygate 29. The second polygate 30 is insulated from the first polygate 29 and has a second polygate extension 30a to the right of the photodiode 25 extending vertically downward from the second polygate 30, partly overlapping the VCCD 28 and the partly overlapping the first polygate extension 29a (i.e. extending beyond a bottom edge of the photodiode 25), such that the second polygate extension 30a extends down for a full width "A"' of the photodiode 25 and partly overlaps the photodiode 25. A third polygate 31 is formed extending in a horizontal direction over the first polygate 29 and alternating with the second polygate 30. The third polygate 31 is insulated from the first polygate 29 and has a third polygate extension 31a to the right of the pholod ode 25 extension 29a of vertically downward from the third polygate 31, partly overlapping the VCCD 28, partly overlapping the photodiode 25 and partly overlapping the first polygate extension 29a of alternate first polygates 29 such that the third polygate extension 31a extends down for a full width A' of the photodiode 25. (It should be evident from this description and the figures that a plurality of first, second and third polygates are actually formed to create a structure with alternating second and third polygates 30 and 31 around alternating photodiodes 25.) A channel stop layer 27 is formed around every photodiode 25, having a gap on the right of the photodiode 25 through which the charge generated in the photodiode 25 is transmitted to the VCCD 28. In the second embodiment of the present invention, the width of the photodiode 25 on the right side of the photodiode 25 (i.e. on the side facing the VCCD 28) is designated as A', a length of the second polygate extension 30a (or the third polygate extension 31a) is designated as B', and a width of the gap in the channel stop layer 27 is designated as C'. It can be seen from the above description and the figures that C' is almost identical to A'.

Although the second embodiment is similar to the first embodiment, the second embodiment has the first, second and third polygates 29, 30 and 31 for transmission of the charge from the photodiodes 25. The first, second and third polygates 29, 30 and 31 are formed on three different layers with an insulation layer between the second and the third polygate extensions 30a and 31a. The side of the second and third polygates 30 and 31 through which the charge from the photodiode 25 is transmitted is formed overlapping the photodiode 25. The second and third polygate extensions 30a and 31a which transmit the charge may extend downward beyond a bottom edge of the photodiode 25.

The second embodiment of the present invention has a configuration which can be used when allowances for etching or exposure of the second polygates 30 are insufficient due to a narrow gap between an extension of the second polygate 30 and an adjacent second polygate 30 where the second polygates 30 cross the VCCDs 28 in the first embodiment, or when a polysilicon layer, formed on the entire surface including the first polygates 29, is selectively patterned by photolithography and etching into the second polygate 30. That is, the second polygate 30 is formed overlapping not every first polygate 29, but every other first polygate 29, since the second polygate 30 and the third polygate 31 alternate and are formed on different layers.

Referring to FIG. 11 showing a cross-section across line VII–VII' in FIG. 8, a first p-type well 22 is formed in an n-type semiconductor substrate 21, a second p-type well 26 is formed in the first p-type well 22, and the VCCD 28 is formed in the second p-type well 26. The first polygates 29 are formed in a direction vertical to the VCCD 28 at fixed intervals, and the second polygates 30 are formed between the first polygates 29 overlapping a portion of the first polygate 29. The second polygates 30 are formed alternating between the first polygates 29. The third polygates 31 are formed between the first polygates 29 alternating with the second polygate 30, overlapping a portion of the first polygate 29. An insulating layer 32 is formed between the n-type semiconductor substrate 21 and the first polygates 29, between the first polygates 29 and the second polygates 30, and between the second polygates 30 and the third polygates 31. That is, the second polygates 30 and the third polygates 31 are formed on different layers. With this formation of the second and third polygates 30 and 31 on different layers, the second polygate extension 30a can be extended further downward beyond the bottom edge of the photodiode 25. In this instance, an edge of the third polygate extension 31 will overlap a portion of an edge of the second polygate 30 over the first polygate 29 and the VCCD 28. That is, the second and third polygates 30 and 31, which are used as transfer gates, are extended to the maximum at locations over the VCCDs 28 in order to maximize the transfer of the charge from the photodiode 25.

Figure 12:
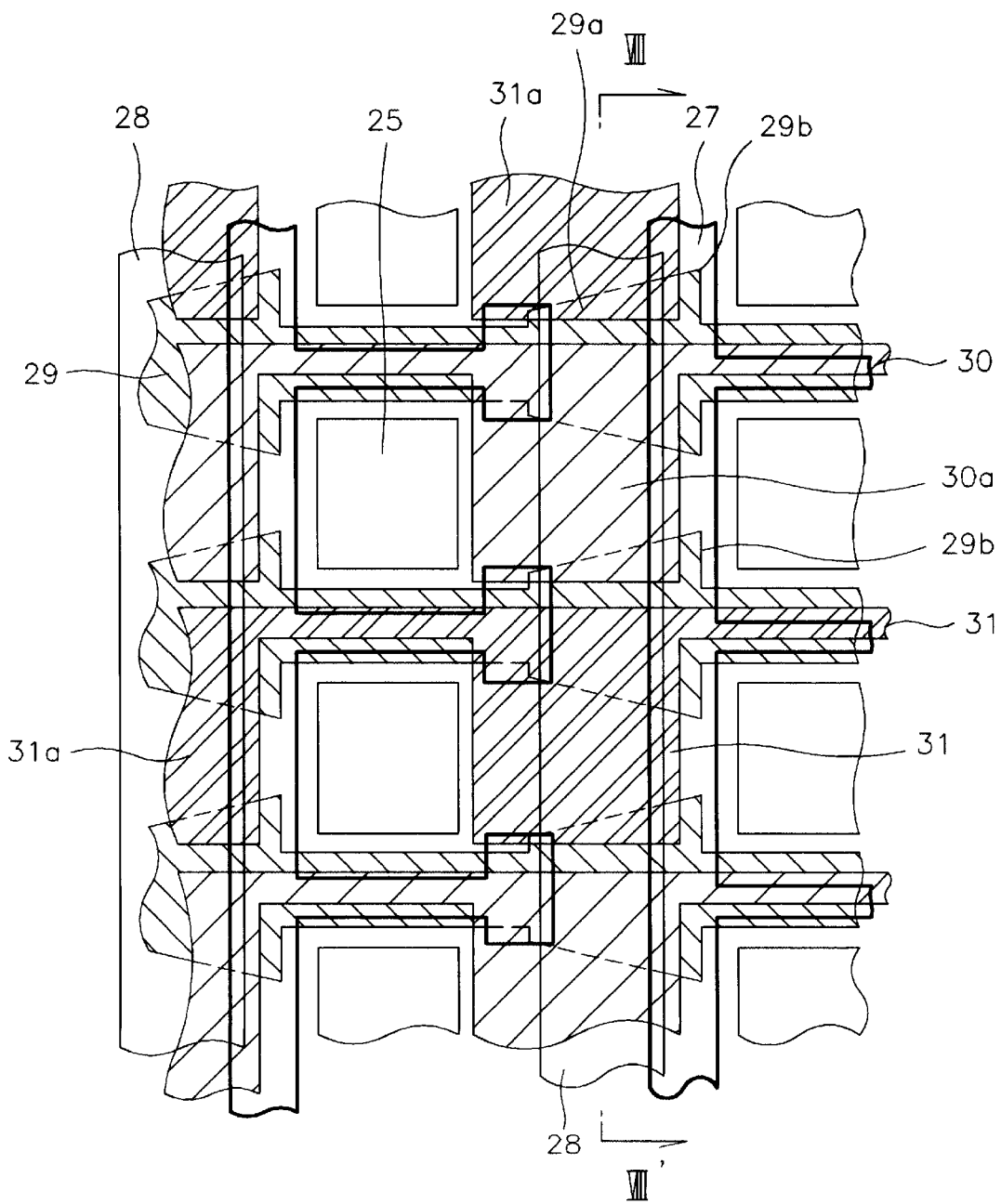
FIG. 12 illustrates a layout of a solid state image sensor according to a third preferred embodiment of the present invention.
Figure 13:
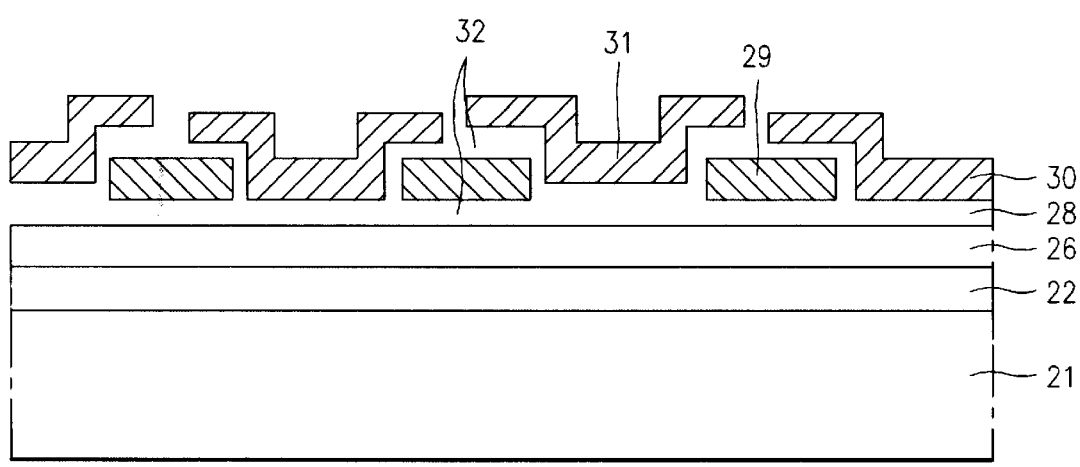
FIG. 13 illustrates a cross-section of the solid state image sensor across line VIII–VIII' of FIG. 12.

FIG. 12 illustrates a layout of a solid state image sensor according to a third preferred embodiment of the present invention, and FIG. 13 illustrates a cross-section of the solid state image sensor across line VIII–VIII' of FIG. 12. The third embodiment of the present invention is similar in structure to the second embodiment, but has an addition of a flared portion 29b to the first polygate 29 which flares out over the VCCD 28, as seen in FIG. 12. This form of the first polygate 29 allows the polygate 29a to have a greater area over the VCCD 28, which is relatively small compared to areas of the second and third polygates 30 and 31. Because the lengths of the second and third polygate extensions 30 and 31 overlapping the VCCDs 28 are longer than the width A' of the photodiode 25, the charge from the photodiode 25 can be transmitted through the entire breadth of the second or third polygate extensions 30a or 31a, and then can be easily transmitted in a vertical direction when a clock pulse is applied to the first polygates 29.

Figure 14:
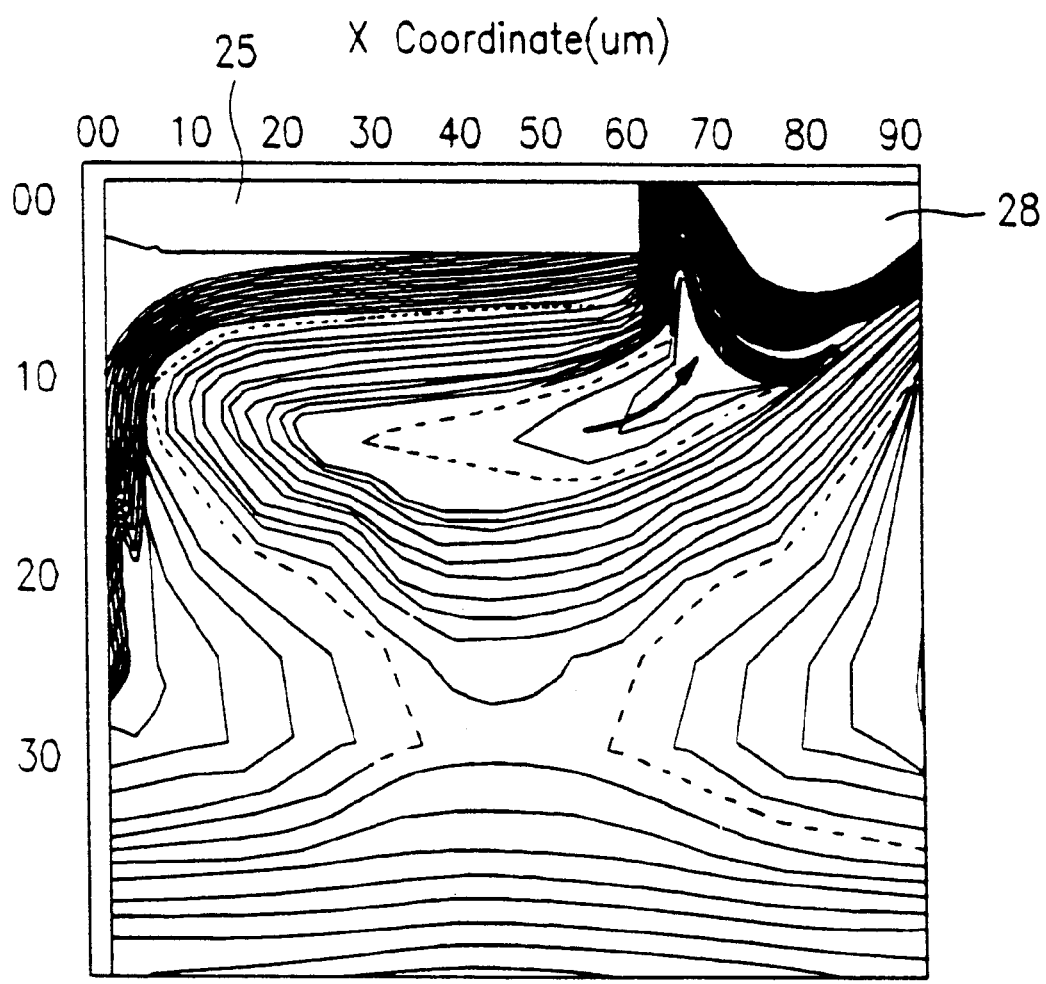
FIG. 14 illustrates a potential contour when a high bias is applied to the transfer gate of the solid state image sensor of the first, second or third preferred embodiments of the present invention.

FIG. 14 illustrates a potential contour when a high bias is applied to the transfer gate of a solid state image sensor of the first, second or third preferred embodiment of the present invention. Referring FIG. 14, because a potential in the first p-type well 21 under a portion overlapping the photodiode 25 becomes low upon application of a high bias to the second or third polygate 30 or 31, the charge generated in the photodiode 25 is read out through the full width of the photodiode 25 resulting in complete discharge of the charge as shown by an arrow in FIG. 14.

Because the portion of the photodiode through which a charge is transmitted to the VCCD 28 fully overlaps a transfer gate, the solid state image sensor of the present invention can easily read out the charge from the photodiode through the broad transfer gate upon application of a high bias to the transfer gate, improving a transfer efficiency of the solid state image sensor, with a subsequent improvement in a picture quality.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A solid state image sensor comprising:
a photodiode;
a vertical charge coupled device positioned to a side of the photodiode for transmitting charges generated in the photodiode;
a first polygate extending in a horizontal direction and partly overlapping the vertical charge coupled device; and
a second polygate extending in a horizontal direction, partly overlapping the vertical charge coupled device and having a second polygate extension, wherein the second polygate extension extends for substantially an entire length of the side of the photodiode.

2. A solid state image sensor comprising:
a plurality of photodiodes arranged in columns and rows;
a plurality of vertical charge coupled devices formed between the columns and extending in a direction of the columns;
a plurality of first polygates extending in a direction of the rows of the photodiodes, located between the rows of the photodiodes and each having a first polygate extension overlapping the plurality of vertical charge coupled devices; and
a plurality of second polygates extending in a direction of the rows of the photodiodes, insulated from the plurality of first polygates, overlapping the plurality of first polygates and each having a second polygate extension extending for a full width of a side of a photodiode facing a corresponding vertical charge coupled device, overlapping the vertical charge coupled devices and overlapping a corresponding first polygate extension.

3. The solid state image sensor according to claim 2, further comprising a plurality of channel stop layers each formed around one of the plurality of photodiodes and having a gap on the side of the one of the plurality of photodiodes.

4. The solid state image sensor according to claim 2, wherein each of the plurality of second polygate extensions partly overlaps a portion of an adjacent photodiode.

5. The solid state image sensor according to claim 2, wherein each of the second polygate extensions extends beyond an edge of an adjacent photodiode.

6. A solid state image senor comprising:
a matrix of a plurality of photodiodes arranged in rows and columns;
a plurality of charge coupled devices formed between the columns of the photodiodes;
a plurality of first polygates extending in a direction of the rows of the photodiodes, located between the rows of the photodiodes and each having a first polygate extension overlapping the plurality of charge coupled devices;
a plurality of second polygates extending in a direction of the rows of the photodiodes, formed between a first group of alternating rows of the photodiodes, insulated from the plurality of first polygates, overlapping the plurality of first polygates and each having a second polygate extension extending for a full width of a side of a photodiode facing a corresponding vertical charge coupled device, overlapping the charge coupled devices and overlapping a corresponding first polygate extension; and
a plurality of third polygates extending in a direction of the rows of the photodiodes, formed between a second group of alternating rows of the photodiodes, insulated from the plurality of first polygates, overlapping the plurality of first polygates and each having a second polygate extension extending for a full width of a side of a photodiode facing a corresponding vertical charge coupled device, overlapping the charge coupled devices and overlapping a corresponding first polygate extension.

7. The solid state image sensor according to claim 6, further comprising, a plurality of channel stop layers each formed around the plurality of photodiodes and having a gap on the side of the plurality of photodiodes.

8. The solid state image sensor according to claim 6, wherein a bias applied to the plurality of second polygates is identical to a bias applied to the plurality of third polygates.

9. The solid state image sensor according to claim 6, wherein each of the plurality of third polygates is a transfer gate for transferring charges from the plurality of photodiodes.

10. The solid state image sensor according to claim 6, wherein an insulating film is formed between a semiconductor substrate and the plurality of first polygates, between the plurality of first polygates and the plurality of second polygates, and between the plurality of second polygates and the plurality of third polygates.

11. The solid state image sensor according to claim 6, wherein the plurality of third polygates and the plurality of second polygates are formed on different layers.

12. The solid state image sensor according to claim 6, wherein a portion of each of the of second polygate extensions overlaps a portion of a corresponding first polygate of an adjacent row, and a portion of each of the plurality of third polygate extensions overlaps a portion of a corresponding first polygate of an alternate adjacent row.

13. The solid state image sensor according to claim 6, wherein each of the plurality of second polygate extensions and each of the plurality of third polygate extensions has a length identicle to a width of a side of an adjacent photodiode facing a corresponding charge coupled device.

14. The solid state image sensor according to claim 6, wherein the plurality of third poligates and the plurality of second polygates alternate.

15. A solid state image sensor comprising:
  a matrix of photodiodes arranged in horizontal rows and vertical columns;
  charge coupled devices extending between adjacent columns;
  first polygates each formed elongated between every adjacent rows of the photodiodes with a portion at every region crossing the charge coupled devices and flaring out in the direction away from a corresponding photodiode and over a corresponding charge coupled device;
  second polygates extending in a direction of the rows of the photodiodes, formed between a first group of alternating rows of the photodiodes, insulated from the plurality of first polygates, overlapping the plurality of first polygates and each having a second polygate extension extending for a full width of a side of a photodiode facing a corresponding vertical charge coupled device, overlapping the charge coupled devices and overlapping a corresponding first polygate extension;
  third polygates extending in a direction of the rows of the photodiodes, formed between a second group of alternating rows of the photodiodes, insulated from the plurality of first polygates, overlapping the plurality of first polygates and each having a third polygate extension extending for a full width of a side of a photodiode facing a corresponding vertical charge coupled device, overlapping the charge coupled devices, overlapping a corresponding first polygate extension,
  wherein the plurality of third polygates and the plurality of second polygates alternate.

16. The solid state image sensor according to claim 15, further comprising channel stop layers each formed around the photodiodes and having a gap on the one side of the photodiode.

17. The solid state image sensor according to claim 15, wherein the portion of the first polygates has extensions in two directions.

18. The solid state image sensor according to claim 15, wherein each of the portions of the first polygates has a width narrower than a width of one of the rows on which one of the first polygates in question is formed in a vicinity of the one side and the other width wider than the width of the one of the rows in a vicinity of the other side.

19. The solid state image sensor according to claim 15, wherein a bias applied to the second polygates is identical to a bias applied to the third polygates.

20. The solid state image sensor according to claim 15, wherein each of the third polygates is a transfer gate for transferring charges from the photodiodes to the charge coupled devices.

21. The solid state image sensor according to claim 15, wherein the second polygates and the third polygates are formed on different layers.

22. A solid state image sensor comprising:
  a photodiode;
  a charge coupled device located at a side of the photodiode and extending in a vertical direction;
  a first polygate crossing the charge coupled device, extending in a horizontal direction and having a first polygate extension extending upward in a vertical direction, partly overlapping the charge coupled device and located at the side of the photodiode; and
  a second polygate crossing the charge coupled device, extending in a horizontal direction and having a second polygate extension extending downward in a vertical direction, partly overlapping the charge coupled device and located at the side of the photodiode, wherein the second polygate extension extends for a fill width of the side of the photodiode.

23. The solid state image sensor according to claim 22, further comprising a channel stop layer around the photodiode and having a gap at the side of the photodiode.

24. The solid state image sensor according to claim 22, wherein the first polygate extension flares out over the charge coupled device.

25. A solid state image sensor comprising:
  a first photodiode located on a substrate and having a top side, a bottom side and a right side;
  a second photodiode located in a vertical direction from the top side of the first photodiode and having a top side, a bottom side and a right side;
  charge coupled devices located at the right sides of the first and second photodiodes;
  a first polygate located between the first and second photodiodes, crossing the charge coupled devices and having an extension overlapping the charge coupled devices and extending upward from the first polygate;
  a second polygate located above the second photodiode, crossing the charge coupled devices and having a second polygate extension overlapping the charge coupled devices, extending downward from the second polygate and partly overlapping the first polygate;
  a third polygate located between the first and second photodiodes, crossing the charge coupled devices and having a third polygate extension overlapping the charge coupled devices, extending downward from the third polygate and partly overlapping another first polygate located below the bottom side of the first photodiode;
  wherein the second polygate extension is at least as long as the right side of the second photodiode;
  wherein the third polygate extension is at least as long as the right side of the first photodiode;
  wherein the second polygate extension overlaps a portion of the second photodiode;
  wherein the third polygate extension overlaps a portion of the first photodiode;

wherein the third polygate extension overlaps a portion of the second polygate; and wherein the second polygate and the third polygate are formed on different layers.

26. The solid state image sensor according to claim 25, wherein the first polygate extension flares out over the charge coupled device.

* * * * *

UNITED STATES PATENT AND TRADEMARK OFFICE
CERTIFICATE OF CORRECTION

| | |
|---|---|
| PATENT NO. | : 6,118,143 |
| DATED | : September 12, 2000 |
| INVENTOR(S) | : Kim |

It is certified that error appears in the above-identified patent and that said Letters Patent is hereby corrected as shown below:

<u>Claim 22,</u>
Line 15, change "fill" to -- full --.

Signed and Sealed this

Twenty-fifth Day of September, 2001

Attest:

*Nicholas P. Godici*

Attesting Officer

NICHOLAS P. GODICI
*Acting Director of the United States Patent and Trademark Office*